US006370358B2

(12) United States Patent
Liimatainen (10) Patent No.: US 6,370,358 B2
(45) Date of Patent: Apr. 9, 2002

(54) MOBILE STATION HAVING DRIFT-FREE PULSED POWER DETECTION METHOD AND APPARATUS

(75) Inventor: Jukka Liimatainen, Oulu (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 09/751,731

(22) Filed: Dec. 29, 2000

Related U.S. Application Data (63) Continuation of application No. 08/746,931, filed on Nov. 18, 1996, now Pat. No. 6,173,160.

(51) Int. Cl.[7] .............................................. H04B 17/00
(52) U.S. Cl. ..................................... 455/67.1; 455/115
(58) Field of Search .............................. 455/67.1, 67.3, 455/115, 116, 126, 127, 151.1, 151.4, 13.4, 522; 330/278, 279

(56) References Cited

U.S. PATENT DOCUMENTS

| | | | |
|---|---|---|---|
| 4,258,719 A | 3/1981 | Lewyn ........................ 327/342 |
| 4,523,155 A | 6/1985 | Walczak et al. ............. 330/279 |
| 4,542,638 A | 9/1985 | Tlaker ........................ 702/104 |
| 4,970,456 A | 11/1990 | Holcomb et al. ............. 324/95 |
| 5,101,175 A | 3/1992 | Vaisanen .................... 330/279 |
| 5,109,538 A | 4/1992 | Ikonen et al. ................. 455/89 |
| 5,128,629 A | 7/1992 | Trinh ......................... 330/129 |
| 5,152,004 A | 9/1992 | Vaisanen et al. .............. 455/68 |
| 5,196,806 A | * | 3/1993 | Ichihara ..................... 330/137 |
| 5,204,643 A | 4/1993 | Verronen .................... 333/81 R |
| 5,212,814 A | * | 5/1993 | Iwane ........................ 455/107 |
| 5,214,372 A | 5/1993 | Vaisanen et al. .............. 324/95 |
| 5,222,104 A | 6/1993 | Medendorp ................... 375/67 |
| 5,230,091 A | 7/1993 | Vaisanen ..................... 455/88 |
| 5,241,694 A | 8/1993 | Vaisanen et al. ............. 455/126 |
| 5,276,917 A | 1/1994 | Vanhanen et al. ............. 455/89 |
| 5,287,555 A | 2/1994 | Wilson et al. .............. 455/115 |
| 5,291,150 A | 3/1994 | Saarnimo et al. ........... 330/279 |
| 5,304,947 A | * | 4/1994 | Carlsson .................... 330/279 |
| 5,369,789 A | 11/1994 | Kosugi ........................ 45/126 |
| 5,371,473 A | 12/1994 | Trinh et al. ................. 330/129 |
| 5,392,464 A | 2/1995 | Pakonen ..................... 455/115 |
| 5,404,585 A | 4/1995 | Vimpari et al. ............. 455/115 |
| 5,423,081 A | 6/1995 | Thiele et al. ............... 455/116 |
| 5,432,473 A | 7/1995 | Mattila et al. .............. 330/133 |
| 5,434,537 A | 7/1995 | Kukkonen ..................... 330/2 |
| 5,438,683 A | * | 8/1995 | Durtler et al. ................ 455/74 |
| 5,493,255 A | 2/1996 | Murtojarvi .................. 330/296 |
| 5,530,923 A | 6/1996 | Heinonen et al. ........... 455/126 |
| 5,594,384 A | * | 1/1997 | Carroll et al. .............. 324/369 |
| 5,604,684 A | 2/1997 | Juntunen .................... 702/104 |

FOREIGN PATENT DOCUMENTS

EP  0 481 524  4/1992  ............ H03G/3/20

* cited by examiner

Primary Examiner—William Trost
Assistant Examiner—Congvan Tran
(74) Attorney, Agent, or Firm—Harrington & Smith, LLP (57) ABSTRACT

In accordance with a method of this invention, and circuitry for performing the method, there is disclosed a process for operating a radio frequency (RF) signal power detector. The method includes the steps of (a) sampling the output of an RF detector circuit to obtain a measurement of a value of the output when no RF signal is input to the RF detector circuit; (b) storing the measurement; and (c) subtracting, when an RF signal is input to the RF detector circuit, the stored measurement from the output of the RF detector circuit to provide a subtracted output signal. In pulsed (e.g., TDMA) embodiments of this invention the step of sampling occurs between RF bursts, while in continuous wave (cw) embodiments the step of sampling occurs during a time that an RF connection is opened or otherwise blocked at an input of the RF detector circuit and a source of the RF signal. A sample and hold function can be provided for sampling and holding the subtracted output signal during a time that the input of the RF detector circuit is blocked. The step of subtracting includes the steps of combining the measured value with a transmitter power setting signal to obtain a corrected transmitter power setting signal; and subtracting the output of the RF detector circuit, when the RF signal is input to the RF detector circuit, from the corrected transmitter power setting signal.

14 Claims, 6 Drawing Sheets

MOBILE STATION HAVING DRIFT-FREE PULSED POWER DETECTION METHOD AND APPARATUS

This application is a continuation of Ser. No. 08/746,931 filed Nov. 18, 1996 now U.S. Pat. No. 6,173,160.

FIELD OF THE INVENTION

This invention relates generally to power detection circuits and method and, in particular, to methods and circuits for detecting the power in a pulsed signal.

BACKGROUND OF THE INVENTION

So-called peak detectors have been used to monitor an applied signal power in a circuit. A primary output of the peak detector is a voltage having a magnitude that is related to the power level. However, at low power levels the magnitude of the output voltage is small and, as a result, the output of the peak detector is strongly influenced by any drift in bias potentials, supply voltage, and the detecting device itself (e.g., a diode). The temperature dependance of the detector device alone has been found to have a significant impact on the accuracy of the output voltage.

The problem due to temperature drift has been addressed in the prior art by using an additional temperature dependent device to compensate for the drift of the detector device. The accuracy of the compensation thus relies on a uniformity of the temperature characteristics of the detector device and the compensating device, as well as on a close physical spacing of these two devices in order to avoid any deviation in temperature between the devices.

It has also been observed that the aging of the components may degrade the compensation, and some prior art circuits have thus required testing and tuning.

Reference can be had to U.S. Pat. Nos. 4,523,155, 4,970,456, 5,222,104 and 5,287,555 for teaching various conventional power control circuit arrangements and detectors.

OBJECTS OF THE INVENTION

It is thus a first object of this invention to provide an improved method for detecting a power level that is not significantly influenced by drift due to temperature and other disturbances, and to thereby enable an accurate power monitoring or control to be achieved.

It is a further object of this invention to provide circuit embodiments that implement improved power detectors.

SUMMARY OF THE INVENTION

The foregoing and other problems are overcome and the objects of the invention are realized by methods and apparatus in accordance with embodiments of this invention.

This invention teaches a method wherein a difference between "off" and "on" states of a pulsed signal is detected so as to provide an accurate indication of the power of the pulsed signal during the "on" state. It is assumed that during the "off" period no significant signal power is present at the input of the detector. It is further assumed that the "on" period is sufficiently short such that no significant drift occurs during the "on" period measurement.

Advantages of the invention arise from the fact that the power detection is based on dynamic properties, for example, the peak envelope sensitivity of the detector device. As such, the detected voltage is determined by dynamic properties of the detector device, which are superior to the static properties (e.g., barrier voltage of the detector diode). The detected voltage representative of the power level is not significantly influenced by long term changes in supply voltage, bias potential, or the barrier voltage of the detecting device.

Furthermore, embodiments of this invention allow more freedom in the design of the detector device biasing network, which can be advantageous in order to stabilize the dynamic sensitivity of the detector device at low power levels. The invention can be implemented in such a way that the detected RF power level begins precisely at zero level, which is beneficial in systems using a low supply voltage. In addition, the zero level of the detector output voltage can begin at any desired level if a suitable reference potential (e.g., ground) is available.

The invention can be implemented in a number of ways depending on the type of application. The circuitry used for an analog implementation may be very simple and inexpensive. A digital implementation uses an analog to digital converter and a digital to analog converter and, while being more complex than the analog embodiment, offers the advantages of digital signal processing.

The power detector and transmitter power controller in accordance with this invention eliminates the need to make separate measurements of a reference detector device, and further eliminates the requirement to provide temperature compensation devices for the power detector device.

In accordance with a method of this invention, and circuitry for performing the method, there is disclosed a process for operating a radio frequency (RF) signal power detector. The method includes the steps of (a) sampling the output of an RF detector circuit to obtain a measurement of a value of the output when no RF signal is input to the RF detector circuit; (b) storing the measurement; and (c) subtracting, when an RF signal is input to the RF detector circuit, the stored measurement from the output of the RF detector circuit to provide a subtracted output signal. In pulsed (e.g., TDMA) embodiments of this invention the step of sampling occurs between RF bursts, while in continuous wave (cw) embodiments the step of sampling occurs during a time that the RF signal is prevented from entering the input of the RF detector circuit, such as by opening a connection between an input of the RF detector circuit and a source of the RF signal. A sample and hold function can be provided for sampling and holding the subtracted output signal during a time that the input of the RF detector circuit is opened.

In one embodiment of this invention the step of subtracting includes the steps of combining the measured value with a transmitter power setting signal to obtain a corrected transmitter power setting signal; and subtracting the output of the RF detector circuit, when the RF signal is input to the RF detector circuit, from the corrected transmitter power setting signal.

In one embodiment of a cw circuit there are two RF detector circuits provided in parallel, and the steps of sampling and storing occur in one RF detector circuit simultaneously with the step of subtracting in the other RF detector circuit. In another embodiment a sample and hold circuit is located at the output of a single RF detector circuit, while in a further embodiment a sample and hold circuit is used at the output of a loop amplifier that forms a portion of a closed loop transmitter power control circuit.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
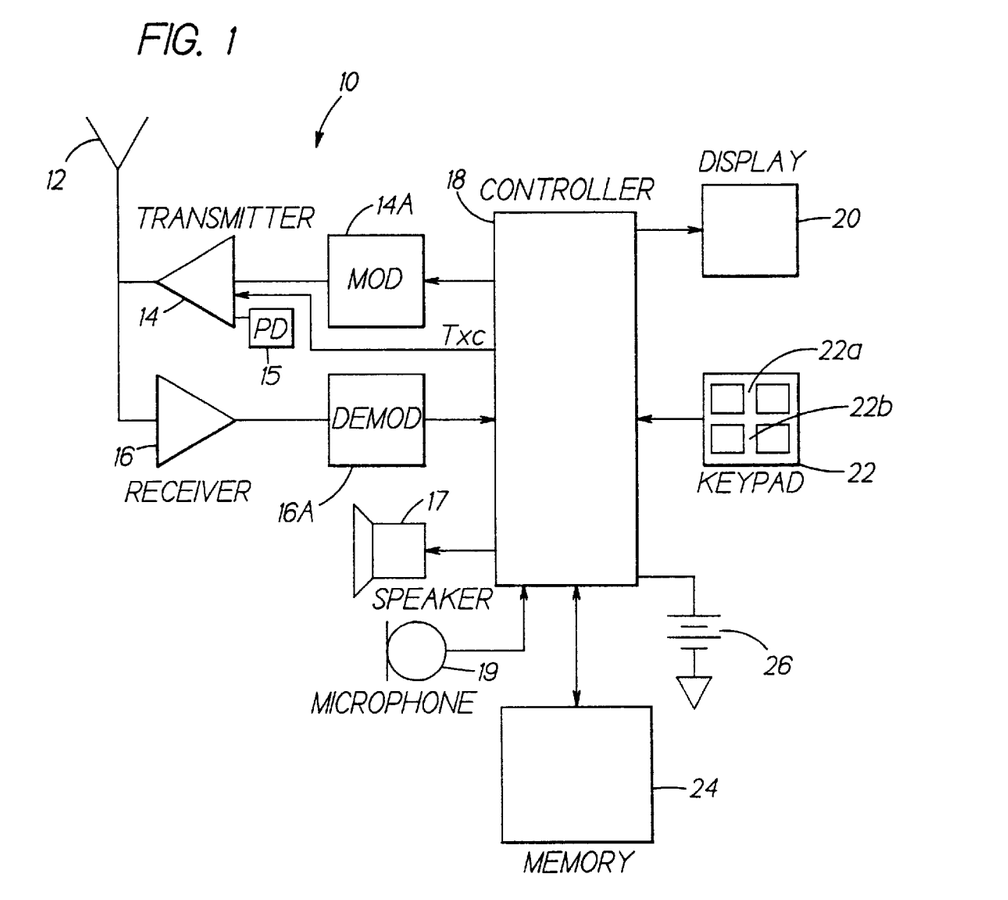
FIG. 1 is a block diagram of a mobile station that is constructed and-operated in accordance with this invention.
Figure 2:
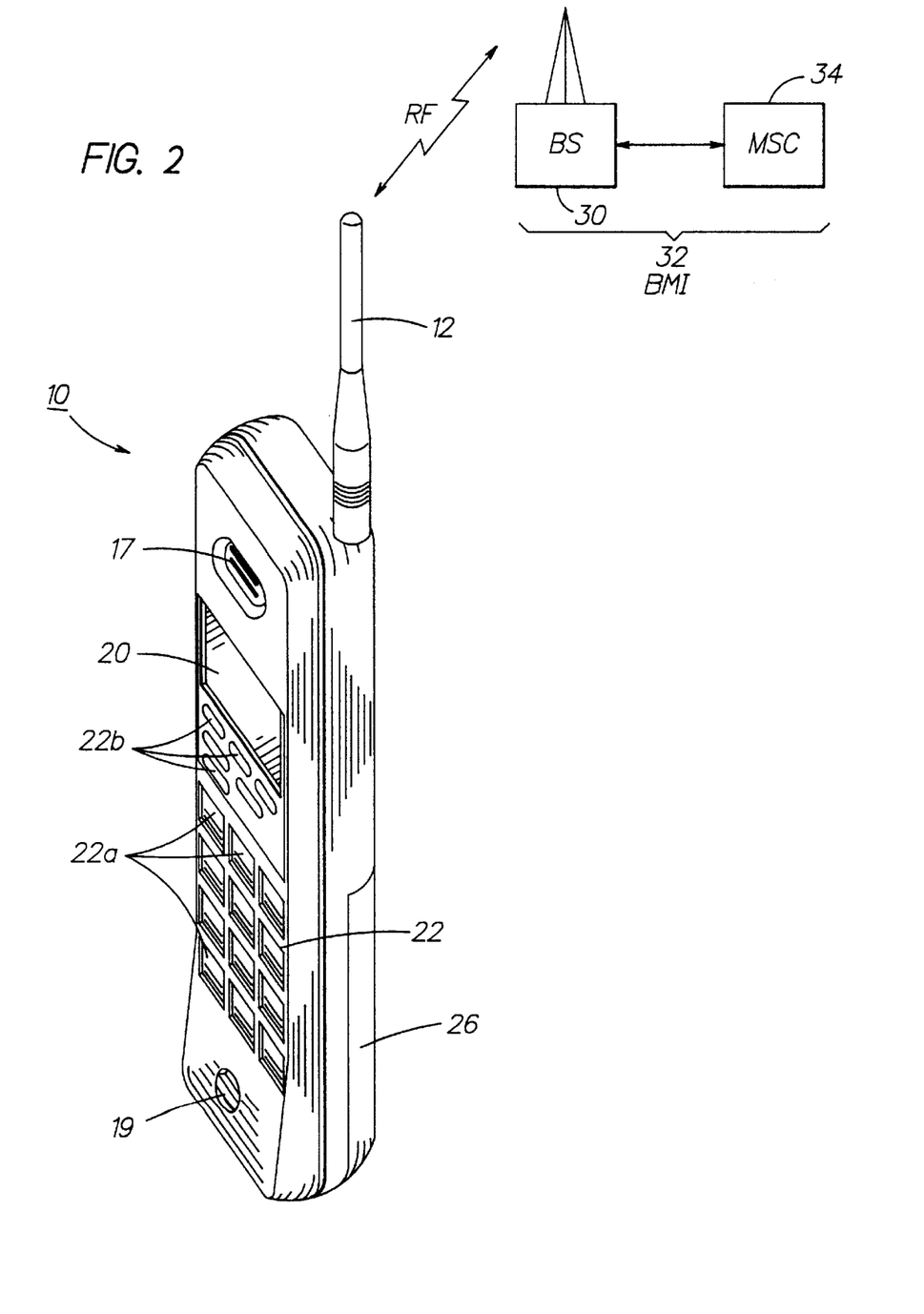
FIG. 2 is an elevational view of the mobile station shown in FIG. 1, and which further illustrates a cellular communication system to which the mobile station is bidirectionally coupled through wireless RF links.

Reference is made to FIGS. 1 and 2 for illustrating a wireless user terminal or mobile station 10, such as but not limited to a cellular radiotelephone or a personal communicator, that is suitable for practicing this invention. The mobile station 10 includes an antenna 12 for transmitting signals to and for receiving signals from a base site or base station 30. The base station 30 may be a part of a cellular network comprising a Base Station/Mobile Switching Center/Internetworking function (BMI) 32 that includes a mobile switching center (MSC) 34. The MSC 34 provides a connection to landline trunks when the mobile station 10 is involved in a call.

The mobile station includes a modulator (MOD) 14A, a transmitter 14, a receiver 16, a demodulator (DEMOD) 16A, and a controller 18 that provides signals to and receives signals from the transmitter 14 and receiver 16, respectively. These signals include signalling information in accordance with the air interface standard of the applicable cellular system, and also user speech and/or user generated data. The air interface standard is assumed for this invention to include a slotted frame structure wherein the mobile station 10 transmits one or more bursts of RF power during a given frame period. Suitable air interface standards include IS-136, GSM and DCS 1900, although the teaching of this invention is not intended to be limited only to these specific frame structures, or for use only with TDMA type systems. By example, and as will be made apparent below, the teaching of this invention also applies to mobile stations that transmit a cw RF signal.

A transmitter power detector (PD) 15 is also provided, and a number of embodiments of same are described in detail below.

It is understood that the controller 18 also includes the circuitry required for implementing the audio and logic functions of the mobile station. By example, the controller 18 may be comprised of a digital signal processor device, a microprocessor device, and various analog to digital converters, digital to analog converters, and other support circuits. The control and signal processing functions of the mobile station are allocated between these devices according to their respective capabilities.

A user interface includes a conventional earphone or speaker 17, a conventional microphone 19, a display 20, and a user input device, typically a keypad 22, all of which are coupled to the controller 18. The keypad 22 includes the conventional numeric (0–9) and related keys (#,*) 22a, and other keys 22b used for operating the mobile station 10. These other keys 22b may include, by example, a SEND key, various menu scrolling and soft keys, and a PWR key. The mobile station 10 also includes a battery 26 for powering the various circuits that are required to operate the mobile station.

The mobile station 10 also includes various memories, shown collectively as the memory 24, wherein are stored a plurality of constants and variables that are used by the controller 18 during the operation of the mobile station. For example, the memory 24 stores the values of various cellular system parameters and the number assignment module (NAM). An operating program for controlling the operation of controller 18 is also stored in the memory 24 (typically in a ROM device). The memory 24 may also store data, including user messages, that is received from the BMI 32 prior to the display of the messages to the user.

It should be understood that the mobile station 10 can be a vehicle mounted or a handheld device. It should further be appreciated that the mobile station 10 can be capable of operating with one or more air interface standards, modulation types, and access types. By example, the mobile station may be capable of operating with any of a number of standards, such as GSM and IS-95 (CDMA). AMPS, narrow-band AMPS (NAMPS), as well as TACS, mobile stations may also benefit from the teaching of this invention, as should dual or higher mode phones (e.g., digital/analog (IS-41) or TDMA/CDMA/analog phones). It should thus be clear that the teaching of this invention is not to be construed to be limited to any one particular type of mobile station or air interface standard.

Figure 3:
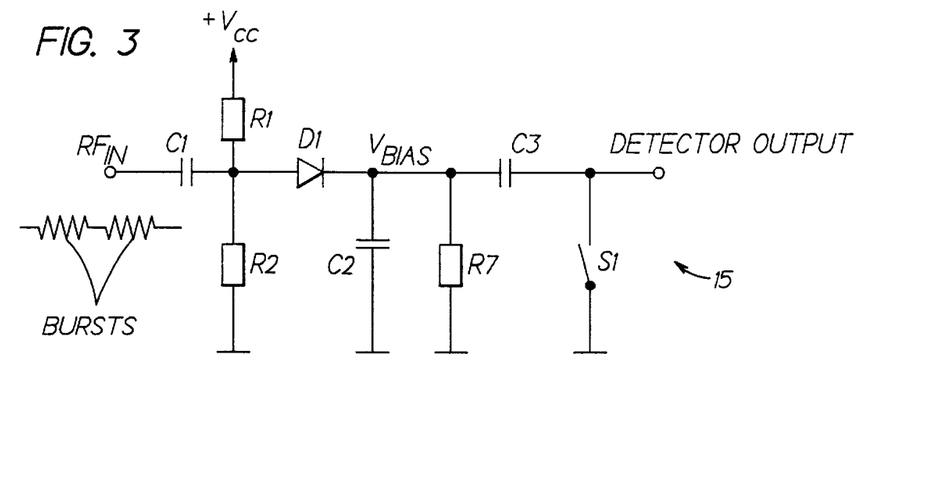
FIG. 3 is a schematic diagram of a first embodiment of a power detector circuit in accordance with the teachings of this invention.

FIG. 3 illustrates a first, analog embodiment of the power detector (PD) 15 shown in FIG. 1. An input node receives a sample of the signal ($RF_{in}$) transmitted by transmitter 14. Resistors R1–R3 provide a bias potential for a detector diode D1. D1 is preferably a Schottky diode, although the invention is not limited to only this type of diode. Those skilled in the art will realize that diode D1 and capacitors C1 and C2 together form an envelope detector.

During the time that $RF_{in}$ is "off", that is, the transmitter 14 is not transmitting a burst, a switch S1 is held closed ("on"). S1 being closed nulls the output (Detector Output) of the power detector 15 which is shorted to a reference potential (e.g., ground) through S1. Also during this time the potential appearing at the cathode of D1 is stored on C3, which is a relatively large capacitance (e.g., 4.7–10 $\mu F$). That is, the magnitude of $V_{BIAS}$ due to the forward current that flows through D1 and R3 to ground (e.g., 0.4 volts), plus any optionally applied offset voltage, is stored on C3. S1 may be, by example, an NPN transistor or a FET. Control of the switch S1 can be made from the controller 18 of FIG. 1.

At a time just prior to $RF_{in}$ turning "on", i.e., the transmitter 14 begins to transmit a RF burst, switch S1 is opened or turned "off". D1 then operates to detect the RF power in the sampled portion of the burst, and the voltage appearing at the Detector Output node represents the peak value of the detected $RF_{in}$ signal ($V_{DET}$) plus bias voltage potential, minus the value of the previously stored potential that was present at the cathode of D1. In this manner the undesired bias voltage potential is eliminated from the Detector Output signal, which is the desired result.

It is assumed that during the $RF_{in}$ "off" period no significant signal power is present at the input of the detector circuit 15. It is further assumed that the duration of the $RF_{in}$ "on" period is sufficiently short such that no significant drift occurs during the "on" period measurement.

It can be appreciated that the embodiment of FIG. 3 provides a wide degree of freedom in selecting the bias point of D1, and also in the overall design of the biasing network, in that C3 functions as a dc blocking capacitor. That is, C3 blocks the D1 bias potential from appearing at the detector output node.

Figure 4A:
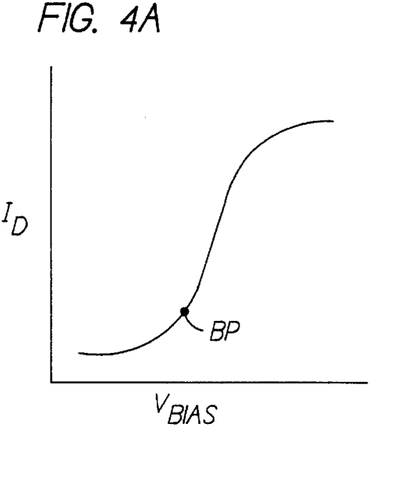
FIGS. 4A and 4B are illustrative graphs of a RF detector diode current versus bias potential and sensitivity versus temperature, respectively.
Figure 4B:
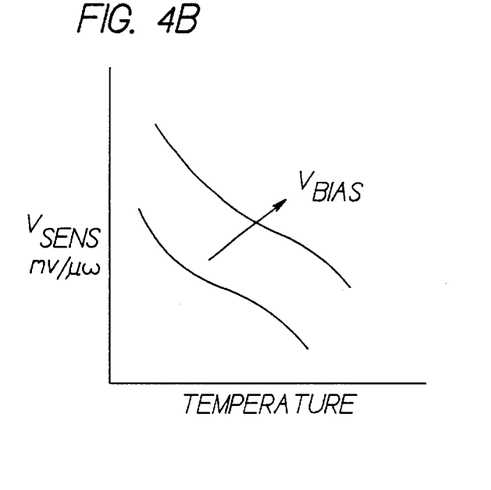

Referring to FIG. 4A, the bias point (BP) of D1 is preferably established so as to operate D1 on the nonlinear portion of the diode transfer curve. A suitable value of diode bias current ($I_D$) is in the range of 150 µA to 200 µA. Referring also to FIG. 4B, it can be seen that the effect of biasing D1 is to shift the curve of voltage sensitivity ($V_{SENS}$) versus temperature so as to increase the voltage sensitivity for a given temperature. In FIG. 3 the values of biasing resistors R1 and R2 are selected as a function of the supply voltage +Vcc, and as a function of the value of R3. The value of R3 is selected, in conjunction with the value of C2, so as to provide an RC time constant that is significantly longer than the period of $RF_{in}$. By example, and assuming that the frequency of the transmitted power in the RF burst is about 2 GHz (e.g., in a DCS 1900 embodiment), then C2 may have a value of 27 pF, and R3 a value of 2.2 KΩ.

Figure 8:
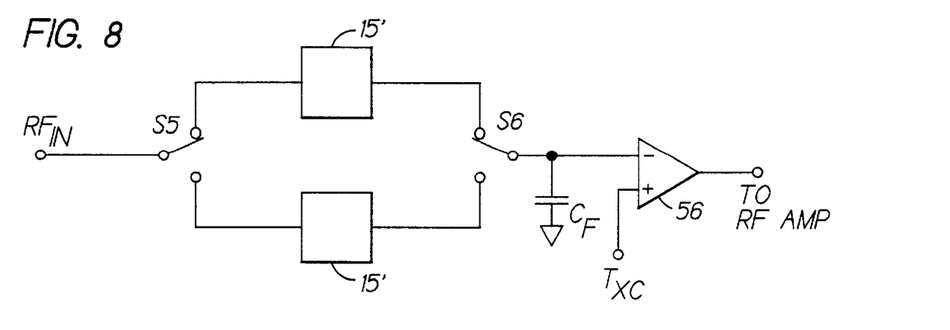
FIG. 8 is a circuit block diagram illustrating a fifth embodiment of this invention.

The Detector Output signal may be connected to an input of an amplifier, and used with a power setting signal (Txc), as is shown generally in FIG. 8 with respect to the amplifier 56.

Figure 5:
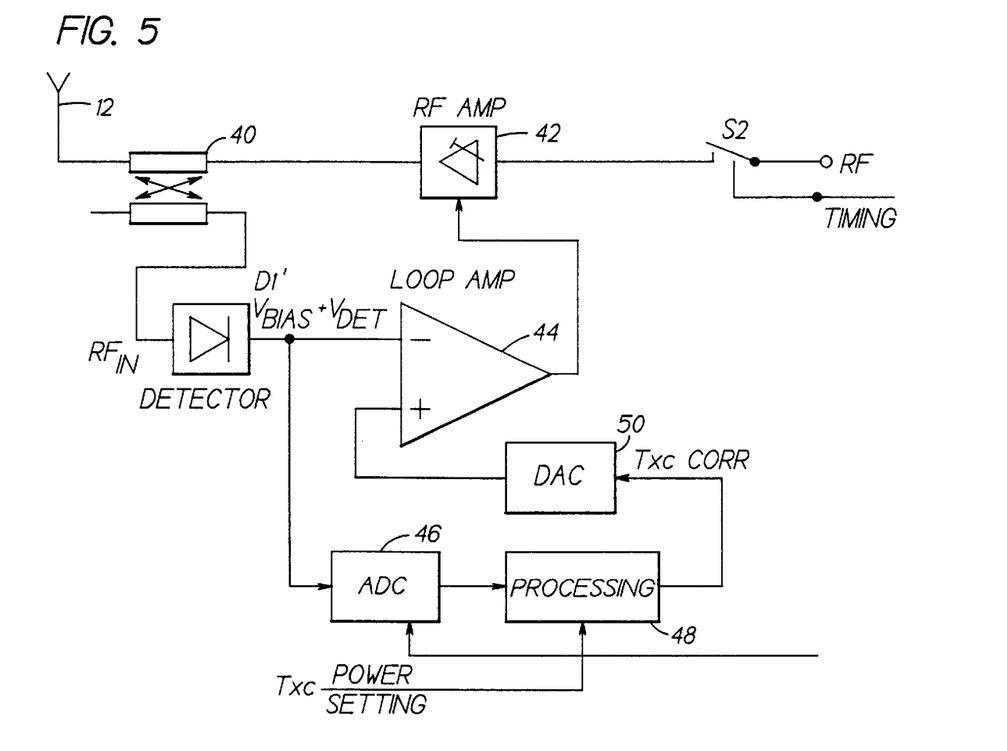
FIG. 5 is a circuit block diagram of a second embodiment of a power detector circuit in accordance with the teachings of this invention.

FIG. 5 illustrates a second, digital implementation of the power detector 15 of FIG. 1 in conjunction with an entire power control loop. In this embodiment the power detector D1' is shown connected to an output of a power coupler 40 which is located at the output of the adjustable gain RF amplifier 42, between the amplifier 42 and the antenna 12. Power coupler 40 may be conventional in construction. D1' is assumed to include the components depicted in FIG. 3, minus the capacitor C3 and switch S1 (see FIG. 7). The amplifier 42 forms a portion of the transmitter 14 in FIG. 1. The output of D1' (both $V_{BIAS}$ and $V_{DET}$) is connected to an inverting input of a loop amplifier 44. The output of D1' is also connected to an input of an A/D converter 46, which in turn has an output connected to an input of a signal processor 48 (which may be included in the controller 18 of FIG. 1). A second input to the processor 48 is the power setting signal, referred to as Txc. Txc is a signal (analog or digital) that represents a desired power level setting for the RF amplifier 42, and which may be supplied by the controller 18 of FIG. 1. An output of the signal processor 48 is connected to an input of a digital to analog converter (DAC) 50, which has an output connected to the non-inverting input of the loop amplifier 44. An optional switch S2 is connected in series with the RF signal to be amplified, and is controlled by a timing signal that is also applied to the A/D converter 46. S2 is optional in that the RF amplifier 42 acts to block the RF signal when the mobile station 10 is not transmitting. If an acceptably low RF leakage level can be obtained at the output of antenna 12, within the control range of RF amplifier 42, then S2 can be eliminated.

In operation, the state of S2 and the sampling time of the A/D converter 46 are timed such that a sample is taken by the A/D converter 46 only when the RF burst is "off". This sampled value is stored, and represents the magnitude of $V_{BIAS}$ output from D1. The processor 48 produces a digital control signal according to the magnitude of Txc, and the previously measured RF "off" sample from A/D converter 46, and provides a corrected Txc signal (Txc CORR). The corrected Txc signal is applied to the non-inverting input of the loop amplifier 44, which operates to subtract, during the RF burst, the magnitude of ($V_{BIAS}+V_{DET}$) from Txc CORR.

Initially the gain of the RF amplifier 42 is at a minimum, and provides blocking of the input RF signal. As Txc CORR begins to increase in magnitude, the output of the loop amplifier 44 rises to keep the power control loop in equilibrium. As such, the output voltage of the loop amplifier 44 depends on the gain control properties of the RF amplifier 42, and thus may not be zero. If the gain of the RF amplifier 42 is greater than or less than the gain specified by Txc, then the output of the loop amplifier 44 will assume some value which will correct the gain of amplifier 42 in a closed-loop manner. In general, the output of the loop amplifier 44 will be within some range (e.g., 0 V to +5 V, −2.5 V to +2.5, etc.) that is predetermined to control the gain of the RF amplifier 42 so as to provide from approximately zero output power to full output power. The end result is that the output of the loop amplifier 44 controls the RF signal output from the RF amplifier 42 such that the total detector output signal caused by the detected RF signal at the input of the RF detector D1', plus the detector bias signal (a voltage in this case), plus any offset signal, is substantially equal to the value of Txc CORR.

In accordance with this aspect of the invention the processor 48, in conjunction with the A/D converter 46, modifies the value of Txc to accommodate the magnitude of $V_{BIAS}$. As the temperature changes and the bias potential of D1 varies, and/or as D1 and the associated components age, these error sources are automatically taken into account and compensated for. The operation of processor 48 and A/D converter 46 may be considered as a digitally implemented sample and hold function for the output of D1' when no RF signal is input to D1'.

Figure 6:
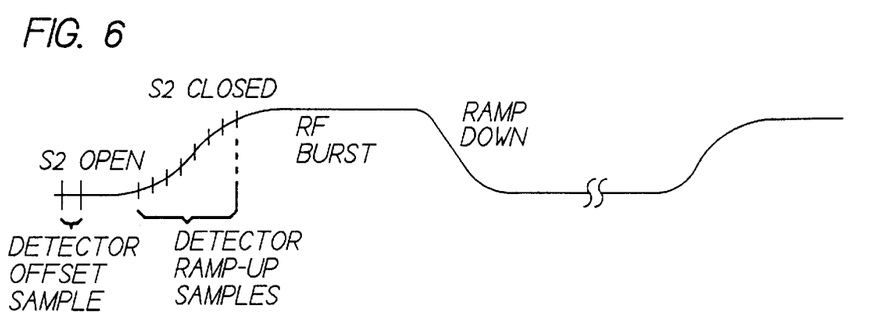
FIG. 6 is an illustrative waveform diagram showing an RF burst and various sampling points and times in accordance with this invention.

Referring to FIG. 6 it can be seen that the RF burst is preceded by a period when, for example, S2 is optionally opened and the A/D converter 46 commanded to sample the output of D1'. During this time the processor 48 stores the digitized value of $V_{BIAS}$ appearing at the output of D1'. S2 is closed prior to the beginning of the RF burst. During the beginning of the RF burst the value of Txc CORR is gradually ramped-up to the commanded level by providing a series (e.g., 32) of values to the D/A converter 50 so as provide a specified ramp-up of the transmitted burst power. The maximum magnitude of the RF burst is eventually established within some tolerance (e.g., 1 dB) of the desired magnitude set by the value of Txc. At the end of the RF burst another series (e.g., 32) of values are provided to the D/A 50 to provide a controlled RF burst ramp-down period. During the burst the value of Txc CORR accommodates the previously measured value of $V_{BIAS}$.

It should be noted that it may not be necessary to sample the output of D1' between each RF burst. By example, in a GSM embodiment the RF bursts typically occur at a rate of one every 4.6 milliseconds, while D1' may be sampled only every, by example, 5 to 10 seconds. That is, due to the typically long term nature of the drift in the output of D1', the sampling of the output of D1' is not required to be accomplished prior to every transmitted RF burst. If the optional switch S2 is provided, then S2 need be opened only when D1' is sampled (e.g., every 5–10 seconds). The actual sample time need only be as long as is required to measure the potential of $V_{BIAS}$, including any required settling time.

Figure 7:
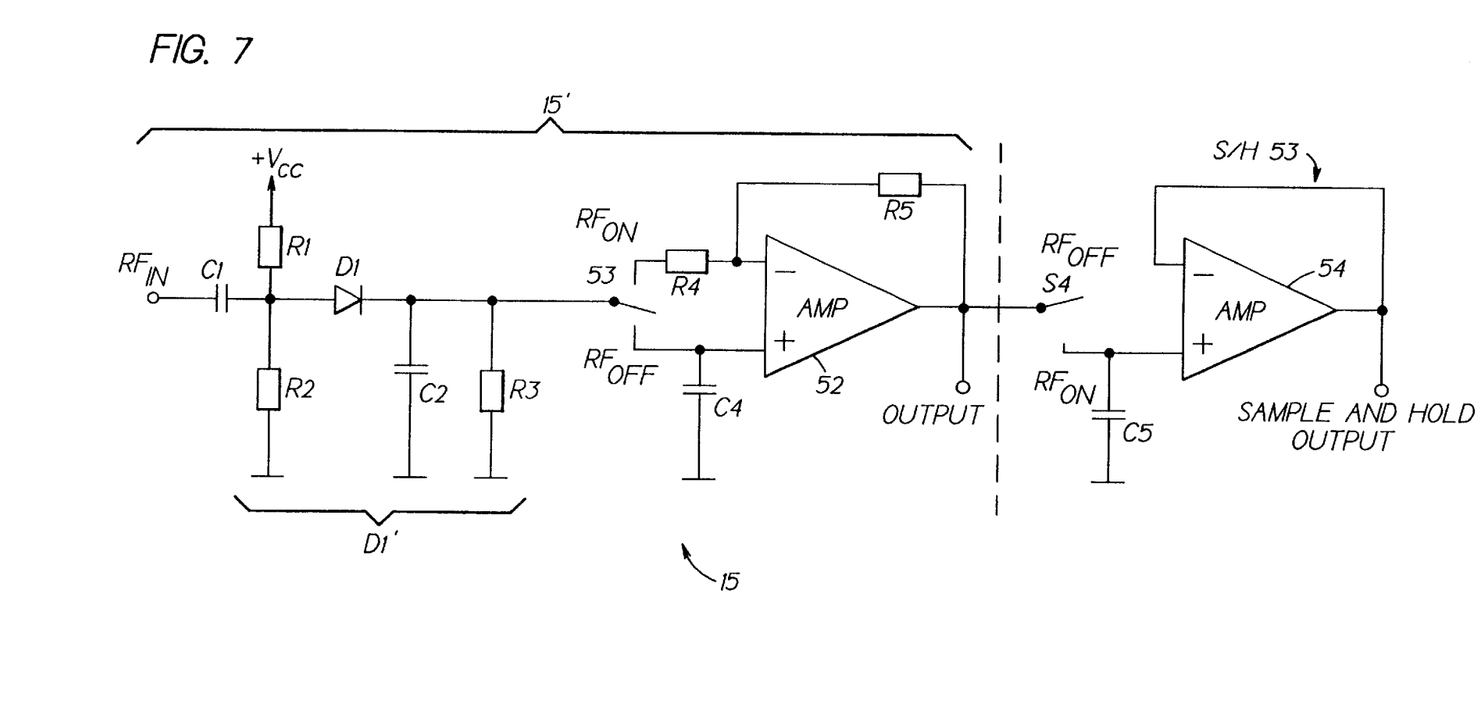
FIG. 7 is a circuit block diagram illustrating a third and fourth embodiments of a power detector circuit in accordance with the teachings of this invention.

FIG. 7 illustrates an embodiment of the power detector 15' using an operational amplifier 52 to cancel the dc drift of the detector circuit D1'. When the RF burst is not present (RF off) S3 switches the output of D1' to capacitor C4. This action, referred to as a calibration period, stores the value of $V_{BIAS}$ on C4. Before applying the RF signal to the input of D1' S3 is toggled to connect the output of D1' to R4, which is connected to the inverting input of amplifier 52. Due to the charge stored on capacitor C4 the voltage at the non-inverting input of the operational amplifier 52 remains at the value determined during the calibration period. Thus the output of the operational amplifier 52 is zero for zero RF input power, assuming that the operational amplifier input offset voltage can be neglected. That is, the potential appearing on C4 cancels the potential applied to R4. A response to RF power is obtained as soon as the RF burst signal is present at the input of D1'. In this case the detected voltage is inverted and amplified by the ratio of resistors R4 and R5, while subtracting the potential (i.e., $V_{BIAS}$ plus any optional offset potential) that appears on C4.

As with the embodiment of FIG. 5, it may not be necessary to sample the output of D1' during each RF burst off period, depending on the leakage of C4, the input impedance of amplifier 52, the bias or leakage current of the amplifier input, and the RF burst repetition rate.

It can be appreciated that the embodiments of FIGS. 3, 5 and 7 can be used to advantage in mobile stations operating in TDMA based systems such as IS-136, GSM, PCN, and DCS 1900, in which the transmitted RF signal is inherently pulsed.

The foregoing embodiments of this invention have been described in the context of pulsed RF signals, such as those encountered in TDMA mobile stations. However, the teachings of this invention may also be applied to the detection of transmitted power in continuous wave (cw) systems, such as the North American AMPS system.

Continuous wave RF signals do not inherently contain off periods that can be used for measuring and cancelling the bias voltage of D1'. In many cases, however, the portion of the transmitted RF signal that is coupled to the envelope detector D1' can be toggled on and off without disturbing the transmitted signal. In this case the teachings of this invention can be extended to also cover cw transmission systems.

If the detector D1' is part of a closed loop control system, the toggling of the RF signal coupled to D1' may disturb the operation of the loop. During the calibration period (RF off) the output of the detector or the loop amplifier should be held constant in order to avoid an undefined state of the control system. This is accomplished by providing, as is illustrated in FIG. 7, an analog sample and hold (S/H) circuit 53 comprised of an amplifier 54 connected as a voltage follower, a sampling switch S4, and a hold capacitor C5. It should be noted that the S/H function can be implemented either at the output of the power detector 15', or at the output of the loop amplifier (see FIGS. 9A and 9B). A digital loop amplifier may also be used if programmed in such a way that the output would remain unchanged during the short calibration period of the detector.

In this embodiment S4 is opened during the RF off period, i.e., when the detector 15' is being calibrated. During this time the previous value of the output of amplifier 52, which was stored (held) on C5 when S4 was closed, is output from the amplifier 54. In this manner a continuous output is provided from the output of the S/H to the power control loop.

If the loss of tracking for even a short detector calibration period cannot be tolerated, then two detectors, connected in parallel as shown in FIG. 8, can be used alternately. That is, while one detector circuit 15' is being calibrated (S5 disconnects the input from $RF_{in}$) the other is connected to the control loop through S6 and amplifier 56. Capacitor $C_F$ is filter capacitor which may be provided to reduce or eliminate any switching transients resulting from the operation of S6 and S5. It should be noted that in this embodiment S5 and S6 are operated in-phase with one another.

Figure 9A:
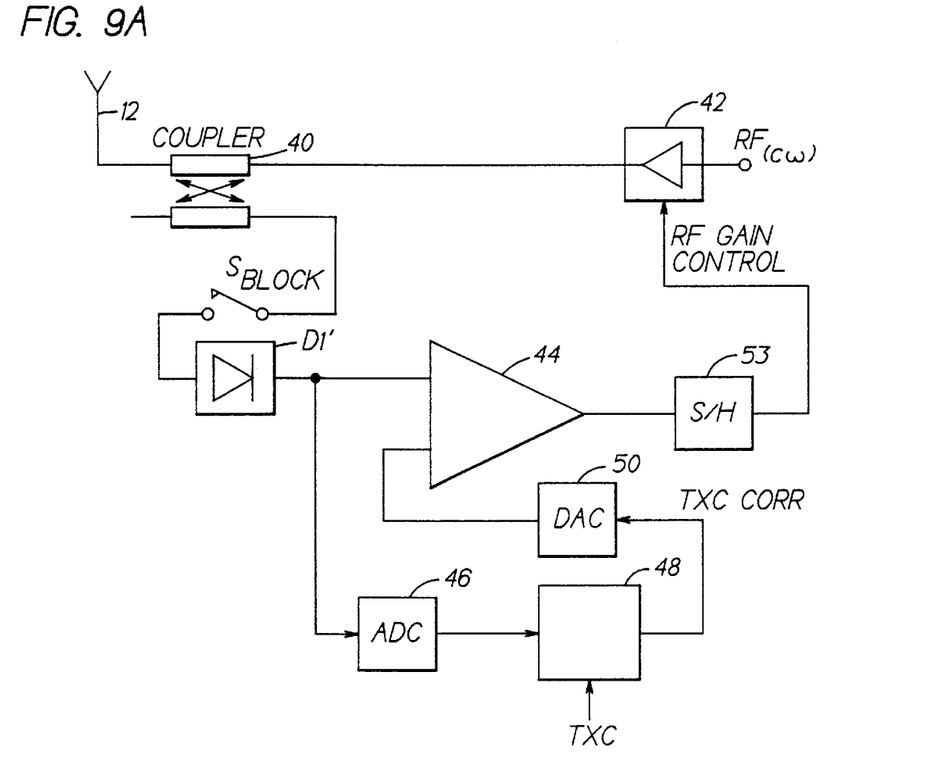
FIGS. 9A and 9B each depict an embodiment of the invention for use with continuous wave (cw) RF signals.
Figure 9B:
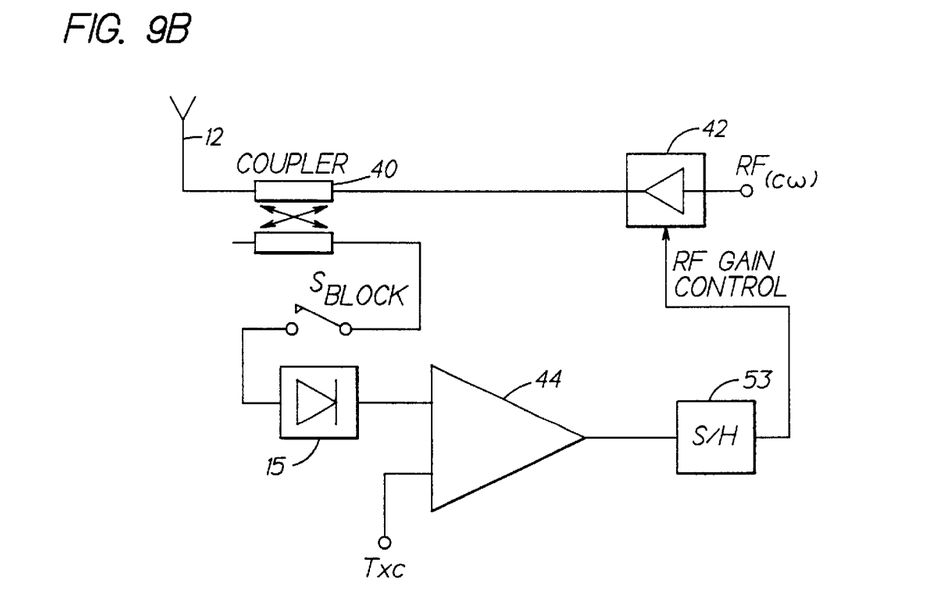

FIGS. 9A and 9B illustrate in greater detail the cw embodiments of this invention, wherein a switch ($S_{BLOCK}$) is positioned between the output of the power coupler and the detector D1', for the embodiment of FIG. 9A, or the detector/drift correction circuit 15 (see FIG. 3), for the embodiment of FIG. 9B. In both of these embodiments $S_{BLOCK}$ is opened when it is desired to sample the magnitude of $V_{BIAS}$ from the detector diode D1. For the embodiment of FIG. 9B the above-described switch S1 is operated out of phase with $S_{BLOCK}$, that is, when $S_{BLOCK}$ is open S1 is closed, and vice versa.

In greater detail, during the detector bias level sampling period the closed control loop operation is temporarily suspended. This is because the RF input into the detector D1 is blocked, and no feedback indication regarding the output power is available. Thus, the closed loop control is temporarily inoperative during the detector bias level sampling period. The S/H 53 is used during this period to hold the gain control signal of the RF amplifier 42 at a fixed potential. The fixed potential has the value that was last sampled during closed loop operation, just before the closed loop operation was suspended. During this period the output of the S/H 53 supplies the RF amplifier 42 power control signal, not the loop amplifier 44. Immediately after opening $S_{BLOCK}$, and placing the S/H 53 in the hold state, $V_{BIAS}$ sampling of the detector output can occur. During the detector calibration period the output power is not controlled by the closed loop, but it can be assumed that for the relatively short calibration period the output power remains substantially constant. At the end of the calibration period $S_{BLOCK}$ is first closed, and thereafter the RF amplifier gain control signal is allowed to be controlled again by the output of the loop amplifier 44, thereby reestablishing normal closed loop operation.

It is also within the scope of this invention to use the embodiment of FIG. 7 at the input to the loop amplifier 44 (i.e., 15' followed by the S/H 53), and to then couple the output of the loop amplifier directly to the gain control input of RF amplifier 42.

Although described in the context of several presently preferred embodiments, it should be realized that a number of modifications to these teachings may occur to one skilled in the art. By example, the various component values, burst repetition rates and the like that were described above are exemplary, and should not be read as a limitation on the practice of this invention. Also, the RF input to the power detector can be blocked in a number of ways, such as by providing a switch at the input to the RF detector to periodically short the RF signal to ground.

Also, when operating in the TDMA embodiment it should be realized that it is possible that an RF signal is continuously provided from the modulator 14A of FIG. 1, but that the RF signal contains modulated information only during a burst time. In this case the actual RF burst can be formed in conjunction with the transmitter amplifier 42.

Thus, while the invention has been particularly shown and described with respect to preferred embodiments thereof, it will be understood by those skilled in the art that changes in form and details may be made therein without departing from the scope and spirit of the invention.

What is claimed is:

1. A method for operating a radio frequency (RF) transmitter power control loop comprising the steps of:

sampling an output of an RF detector circuit to obtain a measurement of a value of the output of the RF detector circuit during a time when an RF signal is not input to the RF detector circuit;

storing the measurement;

during a time when an RF signal is input to the RF detector circuit, using a loop error amplifier for providing a control signal that is corrected by a difference between the stored measurement and the output of the RF detector circuit when the RF signal is input to the RF detector circuit, wherein the step of providing includes the steps of:

converting the measured value from an analog signal to a digital signal representation thereof;

combining the digital representation of the measured value with a transmitter power setting signal to obtain a digital corrected transmitter power setting signal;

converting the digital corrected transmitter power setting signal to an analog corrected transmitter power signal; and during a time when an RF signal is input to the RF detector, subtracting in the loop error amplifier the output of the RF detector circuit from the analog corrected transmitter power setting signal.

2. A method for operating a radio frequency (RF) signal power detector having an input node for receiving RF energy and an output node, comprising the steps of:

providing an envelope detector comprised of a series coupled first capacitance, a diode, and a second capacitance, wherein a first terminal of said first capacitance is coupled to said input node, a second terminal of said first capacitance is coupled to a first terminal of said diode, a second terminal of said diode is coupled to a first terminal of said second capacitance, and a second terminal of said second capacitance is coupled to a reference potential, wherein an output of said envelope detector is taken between said second node of said diode and said first node of said second capacitance;

during a time that an RF signal is not present, establishing a current flow path through said diode, switchably coupling the output of said envelope detector to a third capacitance having a first terminal coupled to a first input of an amplifier and a second terminal coupled to a reference potential, and storing a voltage potential appearing at the output of said envelope detector circuit on said third capacitance; and during a time that an RF signal is present, establishing a current flow path through said diode, switchably coupling the output of said envelope detector to a second input of the amplifier, and obtaining a voltage potential at the output of said envelope detector when the RF signal is present, wherein the amplifier operates to output a signal having a magnitude that is indicative of a difference between the potentials applied to the first and second inputs of said amplifier.

3. A radio frequency (RF) signal power detector having an input node for coupling to a source of an RF signal to be detected and an output node, comprising:

an RF detector circuit having an input coupled to the input node of said RF signal power detector for receiving an RF signal that is input to the input node, and an output; and circuitry including means for sampling the output of the RF detector circuit to obtain a measurement of a value appearing at the output of the RF detector during a time when no RF signal is input to the RF detector circuit, said circuitry including means for storing the measurement wherein said storing means is comprised of a capacitance coupled in series between said output of said RF detector circuit and said output node of said RF signal power detector, and means for subtracting, during a time when an RF signal is input to the RF detector circuit, the stored measurement from the output of the RF detector circuit to provide a subtracted output signal, wherein during the time when an RF signal is input to the RF detector circuit said output of said RF detector is indicative of an amplitude of the RE signal input to the RF detector.

4. A detector as set forth in claim 3, wherein the means for sampling operates between RF bursts.

5. A detector as set forth in claim 3, wherein the sampling means includes means for preventing the RF signal from entering the input of the RF detector circuit during the operation of said sampling means.

6. A detector as set forth in claim 3, wherein the sampling means is comprised of a switch coupled in series between the input of the RF detector circuit and the source of RF power, said switch being operated to open during the operation of said sampling means and to close during the operation of said subtracting means.

7. A detector as set forth in claim 3, and further comprising a sample and hold means coupled to the output of said RF detector circuit.

8. A detector as set forth in claim 3, and further comprising a sample and hold means coupled to the output of said subtracting means.

9. A detector as set forth in claim 3, and further comprising a closed loop RF amplifier gain control circuit that includes said detector, comprising:

means for combining the measured value with a transmitter power setting signal to obtain a corrected transmitter power setting signal; and said means for subtracting subtracts the output of the RF detector circuit, when the RF signal is input to the RF detector circuit, from the corrected transmitter power setting signal.

10. A detector as set forth in claim 3, wherein said sampling means and storing means are comprised of a switch for periodically coupling, during a calibration period, the output of the RF detector circuit to a capacitance connected to a first input of an amplifier for impressing a potential across the capacitance that is equal to a potential output from the RF detector circuit, wherein the switch couples the output of the RF detector circuit to a second input of the amplifier at a termination of calibration period, and wherein the amplifier outputs a signal having a magnitude that is indicative of a difference between the potentials applied to the first and second inputs.

11. A radio frequency (RF) signal power detector, comprising:

an RF envelope detector circuit having an input coupled to a source of RF power and an output;

a dc blocking capacitor coupled in series between said output of said RF envelope detector circuit and an output node; and a switch coupled between said output node and a reference potential; wherein
  said source of RF power outputs bursts of RF power, and wherein said switch is closed between two bursts and opened during a burst.

12. A closed loop transmitter power control system for use in a mobile station comprising:
  a variable gain transmitter amplifier having an input coupled to a source of a RF signal and an output coupled to an antenna;
  a power coupler coupled in series between said output of said amplifier and said antenna;
  a RF detector having an input coupled to an output of said power coupler;
  first circuit means, coupled between said output of said RF power coupler and said input of said RF detector, for periodically preventing the RF signal from entering said RF detector;
  second circuit means having an input coupled to an output of said RF detector, and operating during a time that said first circuit means prevents the RF signal from entering said RF detector, for sampling and storing a magnitude of an output voltage appearing at said output of said RF detector, said second circuit means further operating, during a time that said first circuit means does not prevent the RF signal from entering said RF detector, for subtracting the stored magnitude from the output of said RF detector to provide a corrected RF detector output signal;
  third circuit means for sampling a magnitude of the corrected RF detector output signal and for holding the magnitude of the corrected RF detector output signal for a time just prior to and during said first circuit means operating to prevent the RF signal from entering said RF detector,
  wherein said third circuit means comprises:
    analog-to-digital converter circuit means coupled to the output of the RF detector for converting the output appearing at the output of the RF detector during a time said first circuit means operates to prevent to RF signal from entering said RF detector to a digital representation thereof;
    fourth circuit means for combining the digital representation of the RF output with a transmitter power setting signal and outputting a digital corrected transmitter power setting signal;
    digital-to-analog converter circuit means for converting the digital corrected transmitter power setting signal to an analog corrected transmitter power signal, and
    a loop amplifier having a first input coupled to said output of said third circuit means, a second input coupled to said analog corrected transmitter power signal, and an output coupled to a control input of said variable gain transmitter amplifier, said loop amplifier operating to provide a transmitter gain control signal to said transmitter amplifier that maintains said closed loop power control system in equilibrium.

13. A closed loop transmitter power control system for use in a mobile station comprising:
  a variable gain transmitter amplifier having an input coupled to a source of a RF signal and an output coupled to an antenna;
  a power coupler coupled in series between said output of said amplifier and said antenna;
  a RF detector having an input coupled to an output of said power coupler; first circuit means, coupled between said output of said power coupler and said input of said RF detector, for periodically preventing the RF signal from entering said RF detector;
  analog-to-digital converter circuit means coupled to a output of the RF detector for converting the output appearing at the output of the RF detector during a time said first circuit means operates to prevent the RF signal from entering said RF detector to a digital representation thereof;
  second circuit means having a first input coupled to a transmitter amplifier power setting signal and a second input coupled to said digital representation of said the RF output, said second circuit means having an output for outputting a digital corrected transmitter setting power signal;
  digital-to-analog converter circuit means for converting the digital corrected transmitter power setting signal to an analog corrected transmitter power signal;
  a loop amplifier having a first input coupled to said output of said RF detector, a second input coupled to said analog corrected transmitter power signal, and an output coupled to a control input of said variable gain transmitter amplifier, said loop amplifier operating to provide a transmitter gain control signal to said transmitter amplifier that maintains said closed loop power control system in equilibrium; and
  sample and hold circuit means coupled to said closed loop power control system, and operating during a time that said first circuit means prevents the RF signal from entering said RF detector, for maintaining said transmitter gain control signal at a level that was in effect just prior to a time that said first circuit means prevents the RF signal from entering said RF detector.

14. A closed loop transmitter power control system for use in a mobile station comprising:
  a variable gain transmitter amplifier having an input coupled to a source of a RF signal and an output coupled to an antenna;
  a power coupler coupled in series between said output of said amplifier and said antenna;
  a RF detector having an input coupled to an output of said power coupler, said RF detector comprising means for subtracting a magnitude of a detector bias potential from a magnitude of a detected RF signal plus detector bias potential;
  first circuit means, coupled between said output of said power coupler and said input of said RF detector, for periodically preventing the RF signal from entering said RF detector;
  analog-to-digital converter circuit means coupled to the output of the RF detector for converting the output appearing at the output of the RF detector during a time said first circuit means operates to prevent the RF signal from entering said RF detector to a digital representation thereof;
  second circuit means for combining the digital representation of the RF output with a transmitter power setting signal to obtain a digital corrected transmitter power setting signal;
  digital-to-analog converter circuit means for converting the digital corrected transmitter power setting signal to an analog corrected transmitter power signal;
  a loop amplifier having a first input coupled to said output of said RF power detector, a second input coupled to the analog corrected transmitter power setting signal, and an output coupled to a control input of said variable gain transmitter amplifier, said loop amplifier operating to provide a transmitter gain control signal to said transmitter amplifier that maintains said closed loop power control system in equilibrium; and sample and hold circuit means coupled to said closed loop power control system, and operating during a time that said first circuit means prevents the RF signal from entering said RE detector, for maintaining said transmitter gain control signal at a level that was in effect just prior to a time that said first circuit means prevents the RF signal from entering said RF detector.

* * * * *